(12) United States Patent
Harris et al.

(10) Patent No.: US 6,439,824 B1
(45) Date of Patent: Aug. 27, 2002

(54) AUTOMATED SEMICONDUCTOR IMMERSION PROCESSING SYSTEM

(75) Inventors: Randy Harris; David Peterson; Jeffry Davis, all of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/611,507

(22) Filed: Jul. 7, 2000

(51) Int. Cl.[7] .......................... B65B 21/02; B65B 69/00; B65B 65/04; B65B 65/34
(52) U.S. Cl. .................. 414/416.03; 414/935; 414/938; 134/134; 134/902
(58) Field of Search .............................. 414/938, 935, 414/416.01, 416.03; 134/902, 134, 133

(56) References Cited

U.S. PATENT DOCUMENTS

| | | |
|---|---|---|
| 5,374,153 A | 12/1994 | Nishi |
| 5,656,097 A | 8/1997 | Olesen et al. |
| 6,202,318 B1 * | 3/2001 | Guldi et al. .................. 134/21 |
| 2002/0025244 A1 * | 2/2002 | Kim ............................ 414/217 |
| 2002/0026952 A1 * | 3/2002 | Fujino et al. ................. 134/1.3 |

FOREIGN PATENT DOCUMENTS

JP  2000-114223  *  4/2000  ......... H01L/21/304

* cited by examiner

*Primary Examiner*—Christopher P. Ellis
*Assistant Examiner*—Kenneth W Bower
(74) *Attorney, Agent, or Firm*—Lyon & Lyon LLP

(57) ABSTRACT

A process system for processing semiconductor wafers includes a stocker module, and immersion module, and a process module. A process robot moves on a lateral rail to transfer wavers between the modules. The immersion module is separated from the other modules, to avoid transmission of vibration. Immersion tanks are radially positioned within the immersion module, to provide a compact design. An immersion robot moves batches of wafers on an end effector between the immersion tanks. The end effector may be detachable from the immersion robot, so that the immersion robot can move a second batch of wafers, while the first batch of wafers undergoes an immersion process.

15 Claims, 9 Drawing Sheets

AUTOMATED SEMICONDUCTOR IMMERSION PROCESSING SYSTEM

The field of the invention is automated semiconducted wafer processing systems, used for processing semiconductor wafers, hard disk media, semiconductor substrates, optical media and similar materials requiring very low levels of contamination.

BACKGROUND OF THE INVENTION

Computers, televisions, telephones and other electronic products contain large numbers of essential electronic semiconductor devices. To produce electronic products, hundreds or thousands of semiconductor devices are manufactured in a very small space, using lithography techniques on semiconductor substrates, such as on silicon wafers. Due to the extremely small dimensions involved in manufacturing semiconductor devices, contaminants on the semiconductor substrate material, such as particles of dust, dirt, paint, metal, etc. lead to defects in the end products.

To exclude contaminants, semiconductor substrates are processed within clean rooms. Clean rooms are enclosed areas or rooms within a semiconductor manufacturing facility, designed to keep out contaminants. All air provided to a clean room is typically highly filtered to prevent airborne contaminants from entering into or circulating within the clean room. Special materials and equipment are needed to maintain contaminants within the clean room at adequately low levels. Consequently, construction and maintenance of clean rooms can be time consuming and costly. As a result, the semiconductor processing equipment installed within a clean room should preferably be compact, so that large numbers of semiconductor wafers can be processed within a smaller space, thereby reducing space requirements and costs.

In the manufacturer of Semiconductor devices from wafers, or in the manufacture of similar flat substrate devices (such as wafers, disk media, optical media, etc., collectively referred to herein as "wafers"), it is often necessary or desirable to clean the wafers after certain processing steps. Cleaning is typically performed by rinsing and drying. Centrifugal rinser dryers have long been used for these types of cleaning steps. In centrifugal rinser dryers, the wafers are held within a rotor and spun at high speed, while sprayed with rinsing and drying liquids and/or gases. While centrifugal rinser dryers have been successfully used for many years, contamination of wafers can be even further improved, at least in some applications, by immersion processes.

However, immersion processes have their own engineering challenges. Immersion tanks typically require substantial space, which is disadvantages in a clean room environment. In addition, cross-contamination between liquids in adjacent tanks, or contamination of wafers by vapors of the liquids, must be minimized. Immersion processes and apparatus must also account for dripping of fluid off of the wafers, as they are moved between tanks. The inflow, maintenance, and draining of liquids must also be addressed, along with the handling of vapors generated from the liquids.

Accordingly, it is an object of the invention to provide an improved system for carrying out immersion processes in the manufacture of wafers and similar devices.

It is also an object of the invention to provide an improved immersion module subsystem.

It is a further object of the invention to provide improved immersion tank assemblies.

Other objects and advantages will appear. The invention resides not only in the systems described, but also in the subsystems and sub-combinations described and illustrated.

SUMMARY OF THE INVENTION

In a first aspect of the invention, an automated semiconductor processing system has an indexer or work in progress stocker module or section, and immersion module or section, and a processing module or section. A process robot is moveable between the sections. The immersion module is detached from the stocker and process modules, to avoid transmission of vibration to the immersion tanks in the immersion module.

In a second and separate aspect of the invention, immersion tanks within an immersion module are arranged in an offset radial pattern. As a result, the immersion module has a compact design requiring less floor space in a clean room environment.

In a third and separate aspect of the invention, an immersion robot is centrally positioned between immersion tanks, to facilitate movement of wafers between tanks reducing travel time and distances between tanks, and resulting in a compact design.

In a fourth and separate aspect of the invention, tank lids and controlled air flow help to control vapors generated by fluids in the tanks.

In a fifth and separate aspect of the invention, a quick dump rinse tank is provided for rinsing wafers, and then quickly dumping or removing the rinse fluid, providing reduced contamination levels.

Other advantages are described. The invention resides not only in the system, but also in the sub-systems and sub-assemblies described.

BRIEF DESCRIPTION OF THE DRAWINGS

In the drawings, wherein the same reference number indicates the same element, throughout the several views.

DETAILED DESCRIPTION OF THE DRAWINGS

Figure 1:
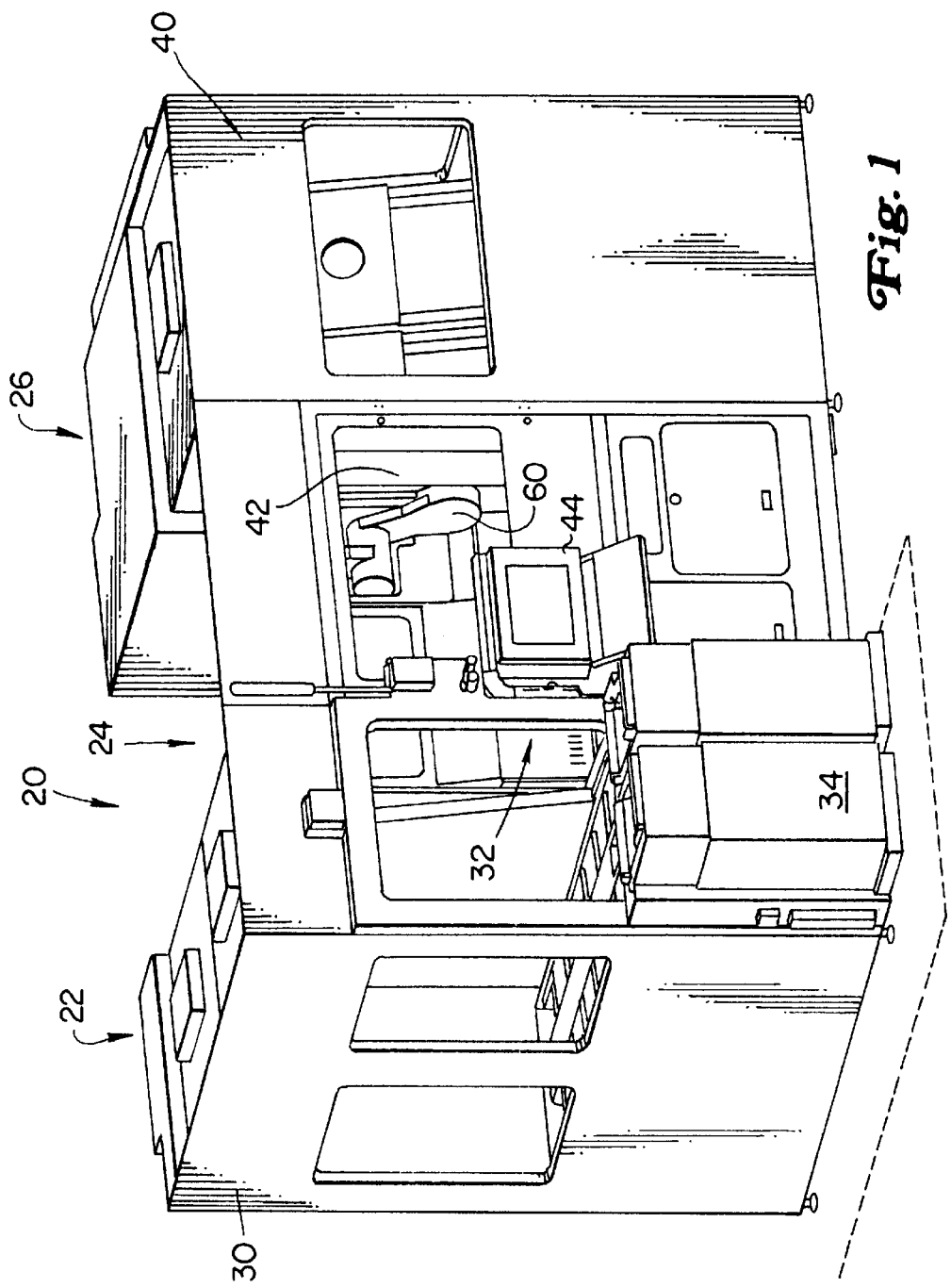
FIG. 1 is a front, left and top perspective view of the present automated semiconductor processing system.
Figure 2:
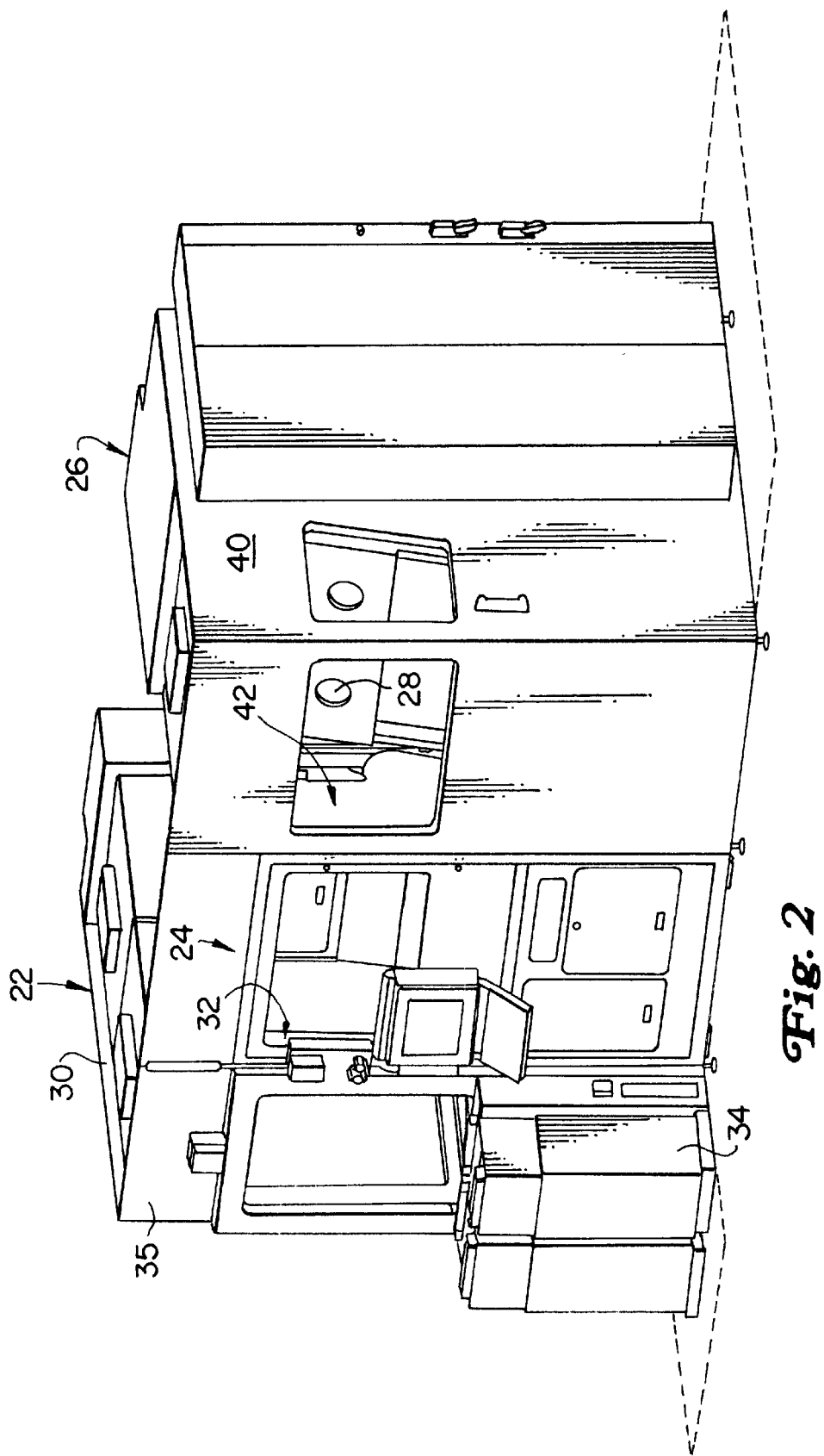
FIG. 2 is a front, top and right side perspective view thereof.
Figure 3:
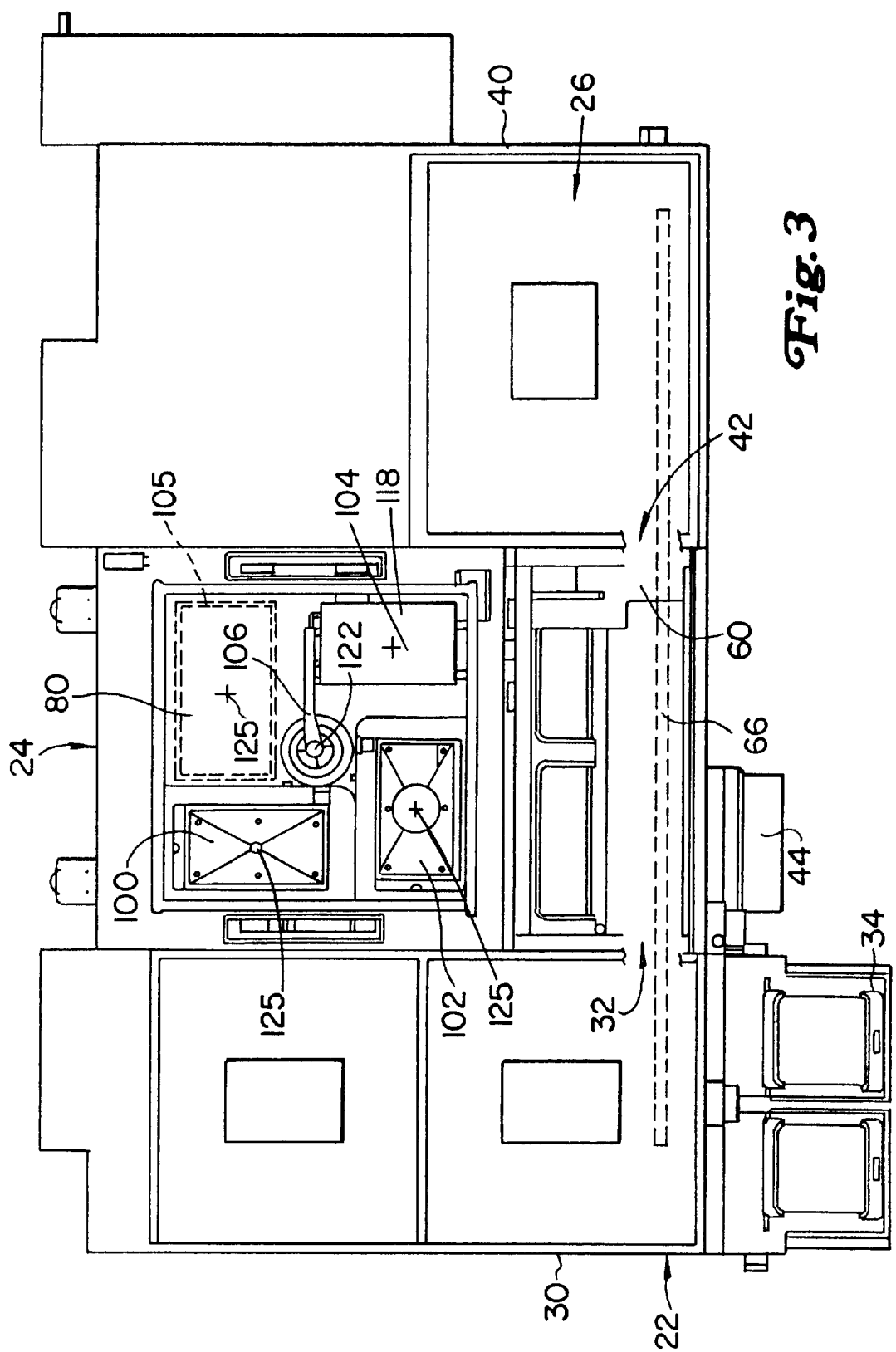
FIG. 3 is a plan view of the system shown in FIGS. 1 and 2.

Turning now in detail to the drawings, as shown in FIGS. 1–3, an automated semiconductor processing system has a stocker module or section 22, and immersion module or section 24, and a process module or section 26. The process robot 60 moves along a lateral rail 66 extending between the three modules. The process robot 60 has an end effector 64 on an articulated arm 62, so that the process robot 60 can engage, lift, carry, install and remove, batches of wafers, or batches of wafers supported in a tray or carrier, between the modules 22, 24 and 26. A stocker module is described, for example, in U.S. Pat. No. 6,279,724, incorporated herein by reference. A process robot and processed module are described, for example, in U.S. Pat. Nos. 5,660,517; 5,784,797, and 5,664,337, incorporated herein by reference. A loader 34 is located in front of the stocker module 22, for loading and unloading batches of wafers into the stocker. The wafers may be contained in a tray, carrier, pod or box.

Referring to FIGS. 1–7, the immersion module 24 is positioned between the stocker module 22 and the process module 26. However, the stocker module 22 and process module 26 both have moving components. The process module 26 typically has centrifugal processors, which spin the wafers at high speeds during processing. The loader and stocker have motors driving various subassemblies and components. This can create vibration, which is disadvantageous during immersion processes. Accordingly, the immersion module 24 is not attached to either the stocker module 22 or the process module 26. Rather, the immersion module 24 has its own housing 70 which is separate from the stocker housing or enclosure 30, and also separate from the process module enclosure 40.

Figure 5:
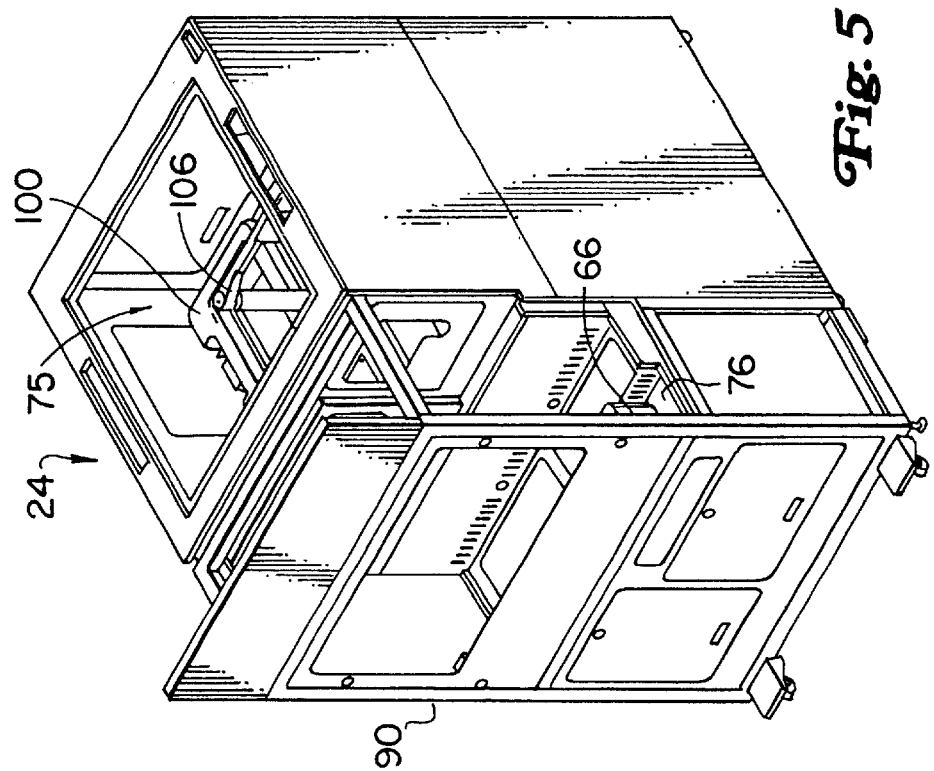
FIG. 5 is a front, top and right side perspective view of the immersion module shown in FIG. 4.
Figure 4:
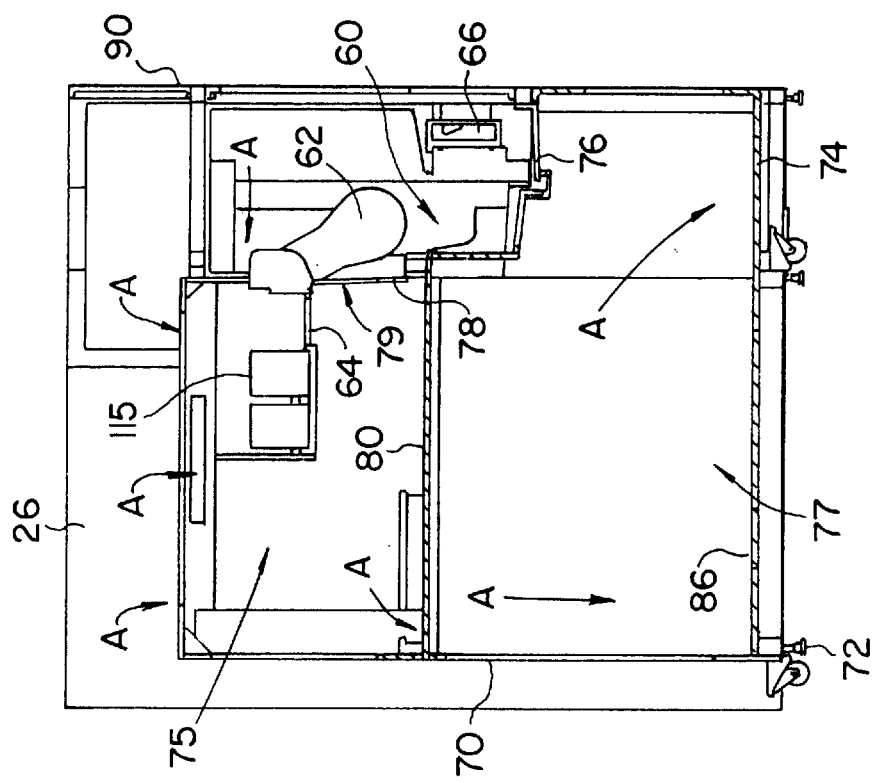
FIG. 4 is a left side view of the immersion module shown in FIGS. 1–3.
Figure 6:
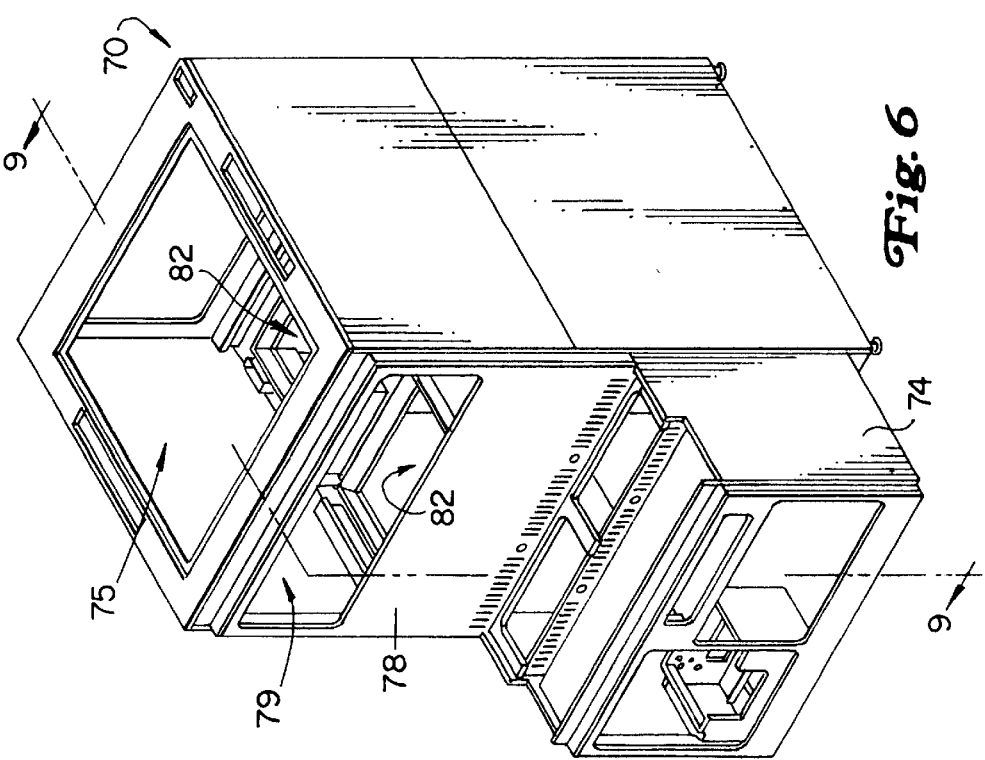
FIG. 6 is a front, top and right side perspective view of the immersion module cabinet or housing.

Referring to FIGS. 4, 5 and 6, the immersion module housing 70 is supported on the floor via leveling legs 72. A housing extension 74 having an extension tray 76 extends forwardly from the immersion module housing 70. As shown in FIG. 4, the lateral rail 66 extends entirely over the housing extension 74, so that the process robot 60 can move between all three modules. However, the lateral rail 66 is not attached to any part of the immersion module 24, to further reduce any transmission of vibration into the immersion module 24. The stocker housing 30 has a side opening 32, and the process module housing or enclosure 40 has a side opening 42, so that the process robot 60 can move into the stocker module 22 and the process module 26.

As shown in FIG. 6, a front panel 78 having an opening 79 separates the immersion module chamber or space 75 from the lateral rail 66.

Figure 7:
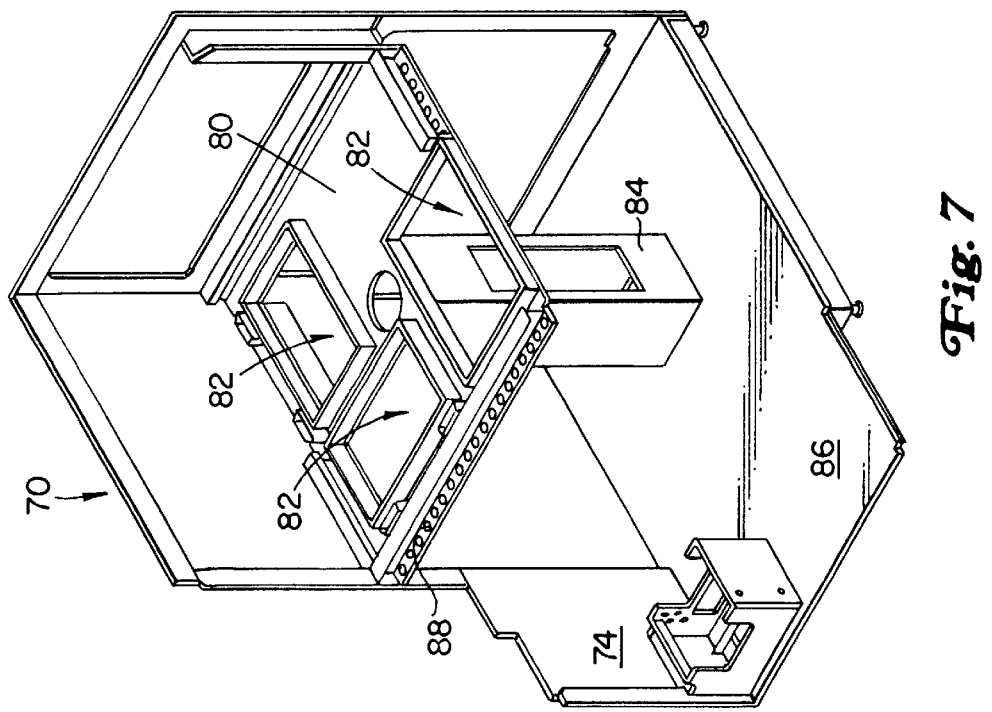
FIG. 7 is a perspective view thereof with cover panels and surfaces removed, for clarity of illustration.
Figure 8:
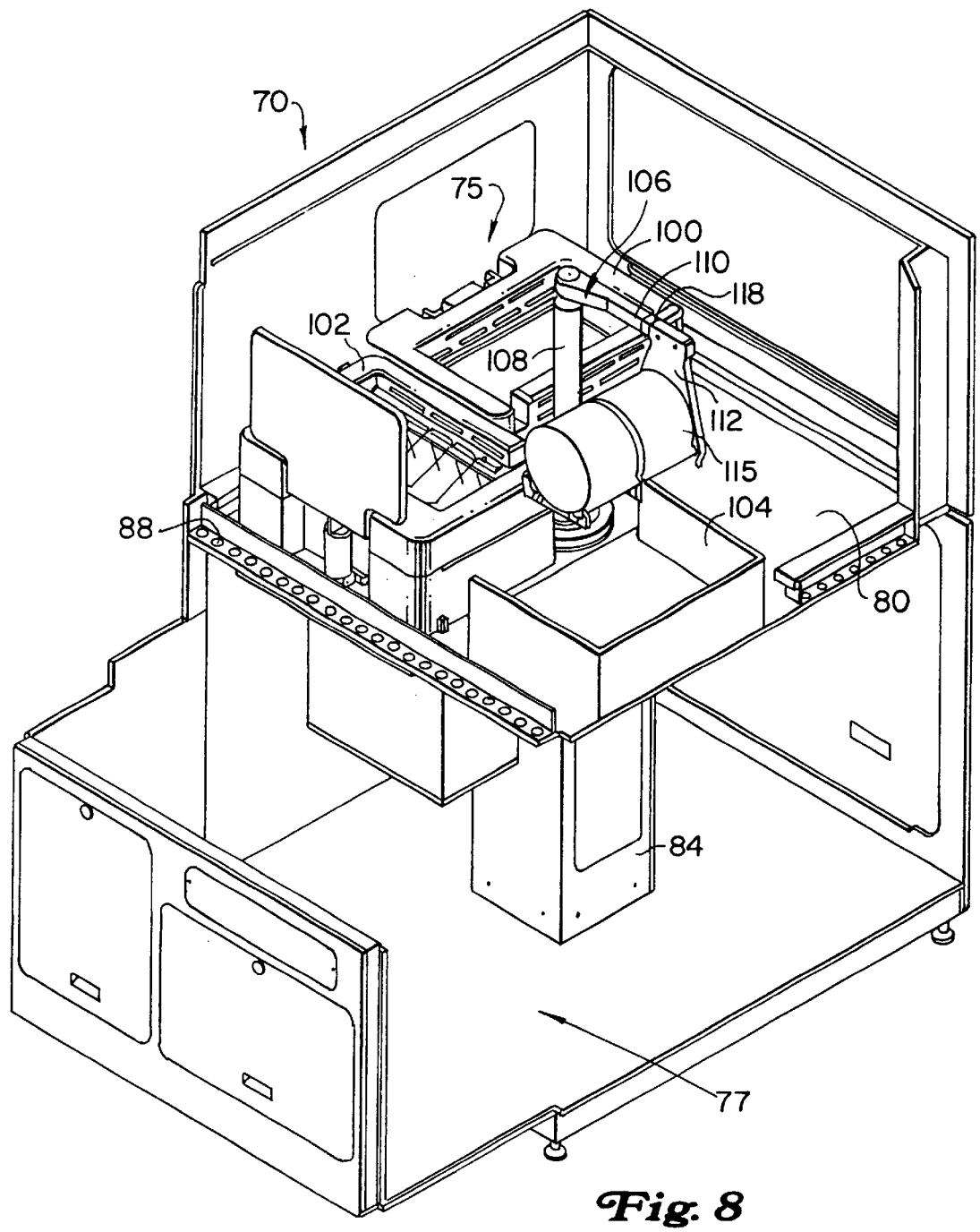
FIG. 8 is a similar perspective view of the immersion module with immersion tanks and immersion robot installed.
Figure 10:
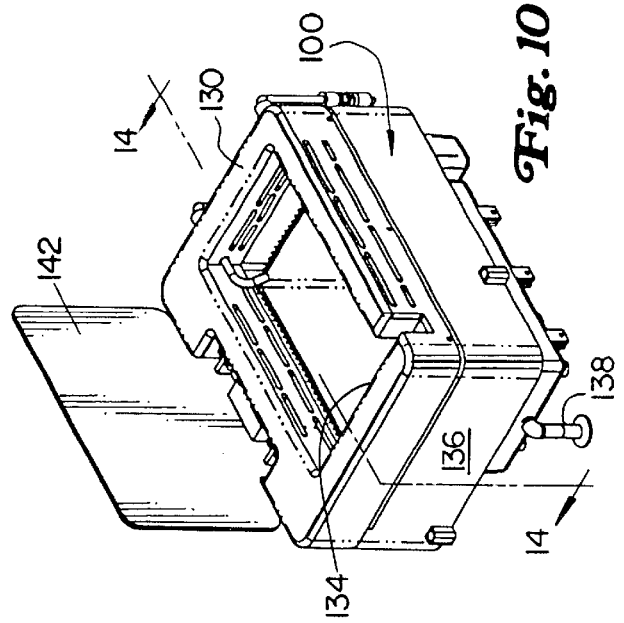
FIG. 10 is a perspective view of a first immersion tank assembly.
Figure 11:
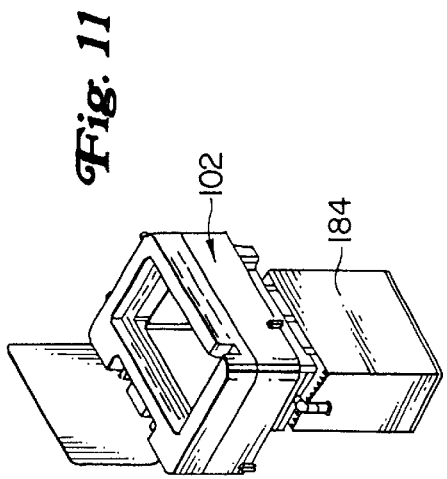
FIG. 11 is a perspective view of a second immersion tank assembly.
Figure 9:
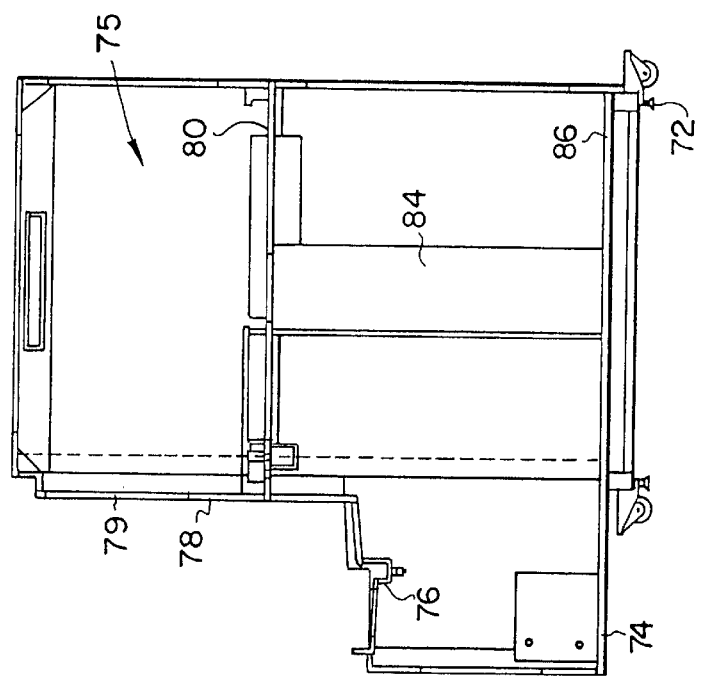
FIG. 9 is a section view taken along line 9—9 of FIG. 6.

Turning now to FIGS. 4, 7 and 8, a deck 80 in the immersion module housing 70 separates the immersion chamber, above the deck 80, from a utility space 77, below the deck 80. The utility space 77 holds fluid tanks, pumps, heaters, filters, and other equipment used in carrying out immersion processes, as is known in the art.

Tank openings 82 are provided in the deck 80. A robot housing 84 is generally positioned between the tank openings 82. A floor panel 86 generally defines the foot print of the immersion module 24, and extends under the deck 80, as well as the housing extension 74. An extension frame 90 is attached to the immersion module housing 70 and housing extension 74, to enclose the area above the housing extension 74 and in front of the front panel 78.

Referring to FIGS. 3 and 8, in the embodiment shown, three tank assemblies are provided. A first tank assembly 100 is preferably set up as a chemical process tank, for performing a chemical immersion step, using e.g., an acid, HF, etc. The second tank assembly 102 preferably provides a quick dump rinse, for rinsing wafers after a chemical immersion step. The third tank assembly 104 preferably provides wafer drying, using known drying techniques . A fourth tank assembly 105, shown in dotted line in FIG. 3, may also be provided. The description of the processes performed by the tank assemblies are examples. Various other immersion processes may also of course be performed using the process system 20.

Referring still to FIG. 3, an immersion robot 106 is centrally positioned between the tank assemblies 100, 102, 104 and 105. As shown in FIGS. 3 and 8, the immersion robot 106 includes an arm 110 attached to a rotation/elevation post 108. An end effector 112 is attached to the arm, and is adapted to carry wafers 11 5, directly, or optionally in a tray or carrier. The arm 110 optionally includes an end effector release joint 118, so that the robot 106 can place an end effector 112 carrying a batch of wafers 115 into one of the tanks assemblies, detach from the end effector 112, and move to a different position to pick up and relocate another batch of wafers, on another end effector 112.

Referring to FIG. 3, the rectangular tank assemblies 100, 102 and 104 (as well as 105 if used) are generally located in an offset radial pattern. The tank centers 125 are offset from each other. The tank assemblies 100, 102, 104 and optionally 105, are nested, so that the end of one tank assembly is facing or alongside the side of an adjacent tank assembly. In addition, the short side of one tank is approximately parallel and coplaner with the long side of an adjacent tank assembly. This design allows the tank assemblies to fit within a small space, providing for a compact immersion module design, which minimizes the clean room floor space required for the immersion module.

Figure 12:
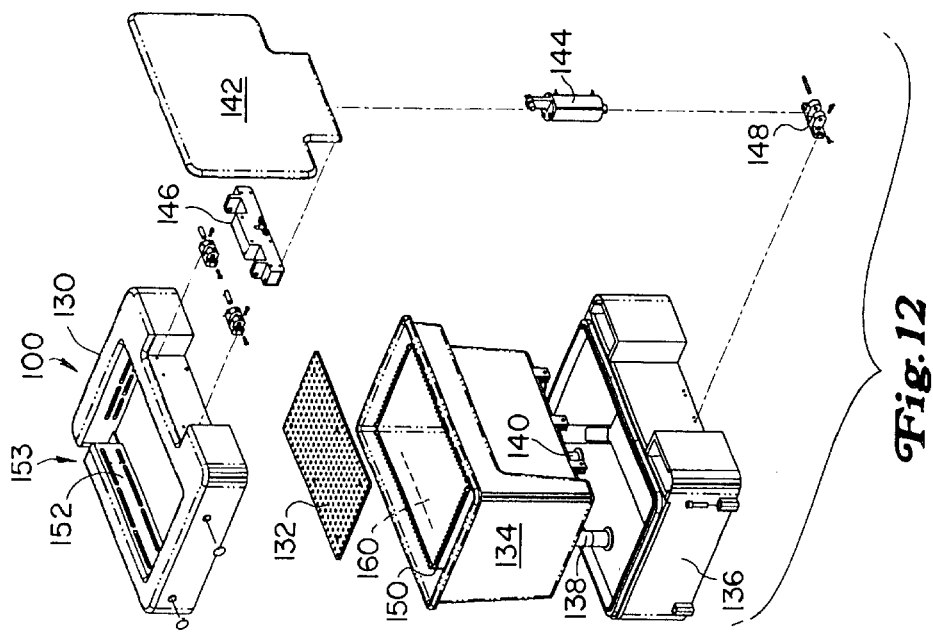
FIG. 12 is an exploded perspective view of the tank assembly shown in FIG. 10.
Figure 14:
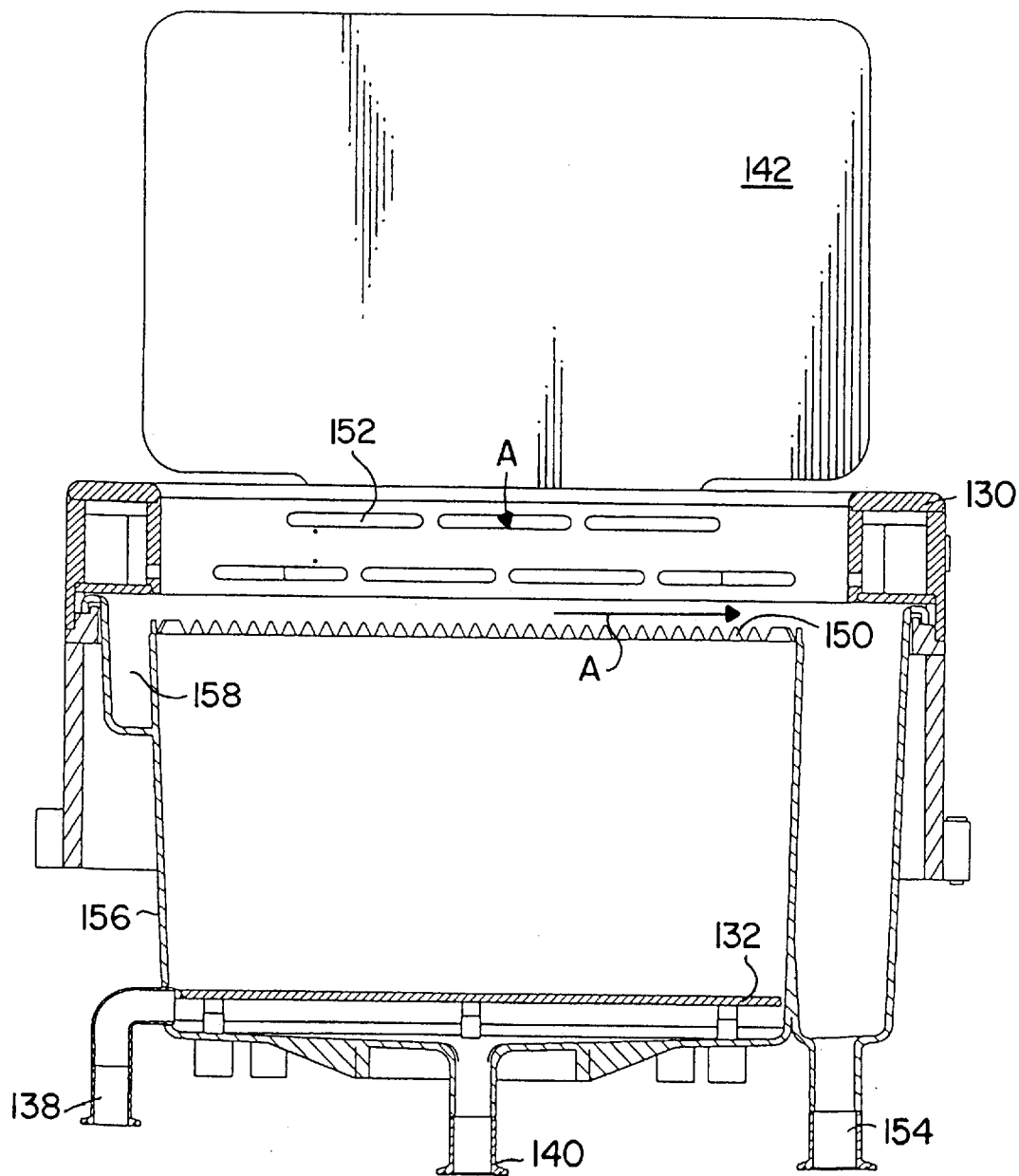
FIG. 14 is a section view taken along line 14—14 of FIG. 10.

Referring now to FIGS. 12 and 14, the first tank assembly 100, which is preferably a chemical solution immersion tank assembly, has an exhaust plenum 130, which is positioned above the deck 80. A tank base 136 surrounds the upper section of the tank 134, and helps to support the tank 134 on the deck 80. The lower end of the tank 134 extends below the deck 80 into the utility space 77. A diffuser plate 132 is located near the bottom of the tank 134, to diffuse liquids provided to the tank.

The first tank assembly 100 includes an inlet 138 for supplying fluid into the tank 134, below the diffuser plate 132. A drain 140 on the tank 134 connects to a drain line. A tank lid 142 is pivotally attached to the exhaust plenum by a lid hinge block 146. A lid actuator 144, which may be electrically or pneumatically driven, is attached to an actuator block 148 on the tank base 136, and to the lid 142, such that the lid 142 can be pivoted open and closed with actuation of the lid actuator 144.

Ridges 150 are provided around the top edges of the inner tank 156, to achieve desired flow characteristics. An overflow channel 158 surrounds the upper edge of the inner tank 156, to collect fluid running over the ridges 150, and channeling the collected overflow fluid to an overflow drain 154. Vents 152 are provided along the inside surfaces of the exhaust plenum, to reduce escape of vapors into the immersion chamber 75.

Figure 13:
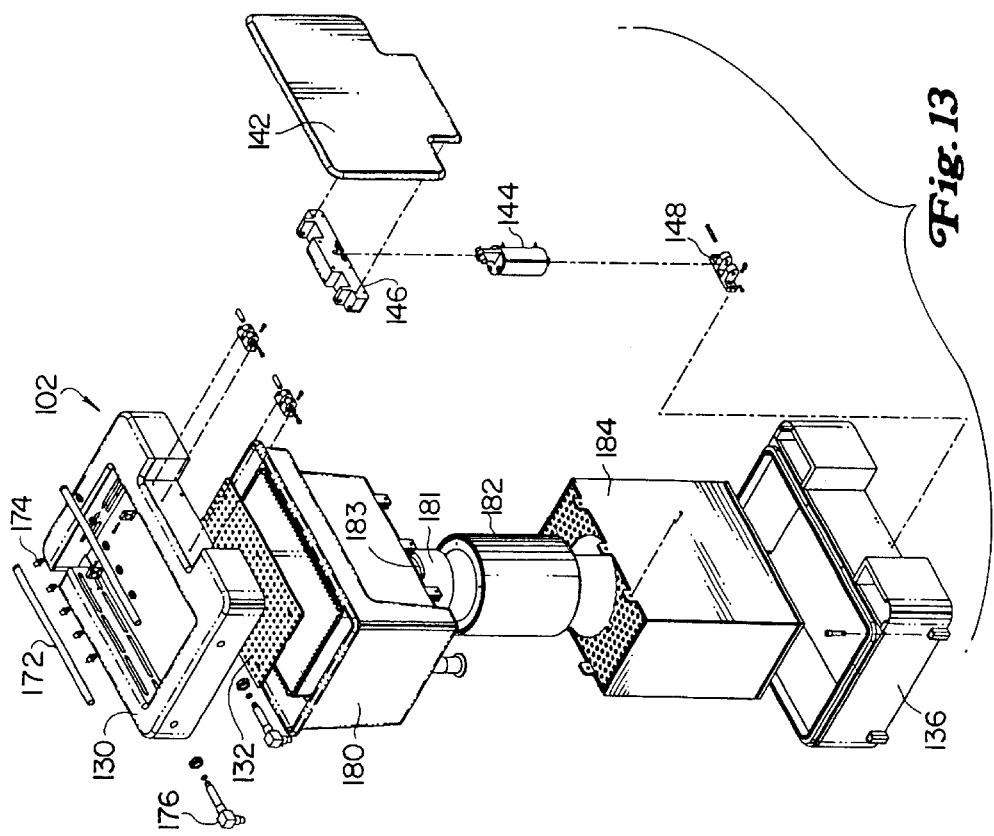
FIG. 13 is an exploded perspective view of the tank assembly show in FIG. 11.

FIG. 13 shows a quick dump rinse tank assembly as a second tank assembly 102. Referring to FIG. 13, the quick dump rinse tank assembly (QDR) has an exhaust plenum 130, a tank base 136, a tank lid 142, actuator 144, actuator block 148, a hinge lid block 146, a diffuser plate 132, etc. as described above with reference to the tank assembly 100 shown in FIG. 12. The tank assembly 102 also has a pair of spray bars 172 along the longer sides of the rectangular exhaust plenum 130. Fluid inlets 176 extend through the exhaust plenum 130, to provide fluid to the spray bars 172. A tank 180 in the tank assembly 102 has a large drain opening 181 controlled by a valve 183. The drain opening 181 extends into a dump reservoir 184, and is surrounded by a shroud 182.

In use, the various movements of robots, actuators, doors, and the control of pumps, heaters, valves, etc. are controlled by the controller 44, or by a separate controller located apart from the process system 20. The process robot 90, in a typical application, withdraws a batch of wafers 115 from a process chamber 28 in the process module, and moves laterally on the rail 66, until the wafers are in alignment with the opening 79 in the front panel 78 of the immersion module 24. The immersion robot 106 is controlled to move the end effector 118, to a position adjacent the opening or window 79, as shown in FIG. 3. The process robot 60 then moves down, off loading the wafers 115 onto the end effector 1 18. The process robot 60 then typically moves to perform other functions within the system 20. The post 108 of the immersion robot 106 turns (180°) so that the end effector 118 carrying the wafers 11 5 is aligned over the first tank assembly 100. The lid actuator 144 is controlled to open the lid 142, immediately before the end effector 118 arrives over the first tank 100. The robot 106 then lowers the end effector holding the wafers into the tank 134. Process fluid is either already present in the tank 134, or is provided into the tank after the wafers 115 are moved into the tank. The wafers 115 undergo an immersion process within the tank 134, using known methods.

As shown in FIG. 12, the exhaust plenum 130 has a cutout 153. This allows the arm 110 to move down to a position flush or below the top surface of the exhaust plenum 130. The tank lid 142 is then closed, via control of the lid actuator 144. Processing with the lid 142 closed reduces release of vapors from the tank assembly 100.

When immersion processing in the first tank assembly 134 is completed, the lid 142 is opened, and the immersion robot 106 lifts the wafers 115 out of the tank assembly 100. The robot 106 then pivots (e.g., 90°) so that the wafers 115 are positioned over the second tank assembly 102.

Referring to FIGS. 8 and 13, the lid 142 of the tank assembly 102 is opened and the robot lowers the wafers into the tank 180. As the wafers 115 are lowered into the tank 180 of the tank assembly 102, they are optionally sprayed, typically with a rinsing fluid, such as de-ionized water, via the spray nozzles 174. After the wafers are lowered entirely into the tank 180, the lid 142 is closed. The wafers 115 are rinsed by a rinsing fluid within the tank 180. At an appropriate time, the valve 183 is rapidly opened, quickly dumping or draining the rinsing fluid out of the tank 180, and into the dump reservoir 184. The drain 181 is large relative to the tank volume, so that the tank can be quickly drained. For example, in the embodiment shown, the drain 181 has an inside diameter of from 90–160 mm, preferably about 125 mm, and the volume of the tank 180 ranges from 20–40 liters, and preferably about 30 liters.

After the tank 180 is drained, the lid 142 of the tank assembly 102 is opened, and the robot 106 lifts the wafers 115 up and out of the tank 180, pivots 90° (counterclockwise in FIG. 3) to position the wafers 115 over the next or third tank 104, typically a dryer, such as a surface tension effect dryer. The lid 142 on the dryer or third tank is opened, and the robot moves the wafers into the third tank, for e.g., drying. After drying, the robot 106 lifts the wafers 115 out of the third tank, an moves them back to the position adjacent the opening 79. The process robot 60 then returns to the immersion module, picks up the wafers from the process robot 60, and carries the wafers to the stocker, where they may be temporarily stored while waiting for removal from the system 20.

Referring to FIG. 4, air flow through the immersion module 24 is controlled to reduce contamination of the wafers 11 5 and to control vapors. As indicated by the arrows A in FIG. 4, air flows downwardly through the immersion chamber 75. Air flows downwardly over the tanks, outwardly towards the walls surrounding the immersion chamber 75, downwardly through down flow vents 88, located along the perimeter of the deck 80, and then into the utility space 77 below the deck 80. Air is then drawn out of the utility area 77 (via a facility vacuum source). This air flow tends to exhaust vapors which may be released from the tanks into the immersion chamber 75.

Air vents 152 in the exhaust plenum 130 also draw vapors from the surface of the liquid in the inner tank 156, with the vapors moved downwardly into the utility space 77 and out of the system 20.

Air flow within the system 20 is configured so that air is constantly flowing into the immersion chamber 75, and exhausting downwardly out of the immersion chamber 75 into the utility space 77 or to a facility air exhaust. This air flow confines vapors to the immersion chamber 75, and also evacuates vapors from the immersion chamber 75, to reduce risk of contamination of the wafers 115.

The window or opening 75 in the front panel 78 through which the process robot 60 moves to deliver or remove wafers 115 to the immersion robot 106 is minimized, to close off the immersion chamber 75 from the rest of the system 20, yet while still allowing robot access. Air flow is controlled so that air flows inwardly into the immersion chamber 75 through the opening 79.

The deck 80 is inclined slightly forward so that any liquid collecting on the deck 80 will run down hill to a collection drain at the front of the deck 80. The floor panel 86 is similarly inclined so that any liquids collecting on the floor panel will run to a floor panel drain.

Mega sonic transducers 160 may optionally be included in the tank assemblies.

Thus, a novel process system, a novel immersion module, and novel tank assemblies and methods have been shown and described. Various modifications may of course be made without departing from the spirit and scope of the invention. The invention, therefore, should not be restricted except to the following claims, and their equivalents.

What is claimed is:

1. A process system for immersion processing wafers, comprising:
    a stocker module having positions for storing wafers to be processed;
    a process module having at least one process chamber;
    an immersion module adjacent to and detached from the process module to avoid transmission of vibration from the process module to the immersion module; and
    a process robot movable between the stocker module, the process module and the immersion module, for carrying wafers to and from the modules.

2. The process system of claim 1 where the immersion module is between the process module and the stocker module.

3. The module of claim 2 further comprising a lip exhaust in the first tank.

4. The system of claim 1 further including an airflow system connected to the immersion module to control flow of vapors within the immersion module.

5. The system of claim 1 further including a track extending in front of the stocker, process and immersion modules, with the process robot moveable linearly along the track.

6. The system of claim 1 with the immersion module comprising:
    a first immersion tank;
    a second immersion tank;
    with the first and second immersion tanks located in an offset radial orientation; and
    an immersion module robot positioned for moving from the first tank to the second tank.

7. The system of claim 6 where the tanks are rectangular and have a pair of long sides attached to a pair of short sides, and with a short side of the first tank parallel and coplaner with a long side of the second tank.

8. The system of claim 6 further comprising a lid on each of the tanks.

9. The system of claim 6 with the immersion module further comprising:

a third immersion tank;

with the first tank radially offset from the second tank, and with the second tank radially offset from the third tank; and with with the immersion module robot having a base located between the first, second and third tanks.

10. The system of claim 9 where the robot is located centrally between the tanks.

11. The system of claim 1 further including a plurality of tanks in the immersion module and an immersion module robot positioned within the immersion module for moving wafers between tanks in the immersion module.

12. The system of claim 11 where the immersion module robot includes an end effector adapted to hold wafers, and with the end effector detachable from the immersion module robot, so that the immersion module robot can place the end effector carrying a first batch of wafers into a first tank within the immersion module, and then move to perform another function within the immersion module, while the first batch of wafers remains immersed in the first tank.

13. The system of claim 11 with at least one of the immersion tank including a quick dump means for rapidly releasing liquid from the tank.

14. A process system for immersion processing wafers, comprising:

a stocker module having positions for storing wafers to be processed;

a process module;

an immersion module adjacent to and detached from the process module and the stocker module to avoid transmission of vibration from the process module to the immersion module;

a track extending along the stocker, process and immersion modules; and a process robot movable on the track between the stocker module, the process module and the immersion module, for carrying wafers to aid from the modules.

15. The system of claim 14 with the track not contacting the immersion module.

* * * * *